United States Patent [19]

Torelli et al.

[11] Patent Number: 4,749,956

[45] Date of Patent: Jun. 7, 1988

[54] FULLY-DIFFERENTIAL OPERATIONAL AMPLIFIER FOR MOS INTEGRATED CIRCUITS

[75] Inventors: Guido Torelli, Alessio; Alejandro de la Plaza, Bergamo, both of Italy

[73] Assignee: SGS Microelettronica SpA, Milan, Italy

[21] Appl. No.: 893,902

[22] Filed: Jul. 18, 1986

[30] Foreign Application Priority Data

Jul. 18, 1985 [IT] Italy ................................ 21627 A/85

[51] Int. Cl.$^4$ ............................................. H03F 3/45
[52] U.S. Cl. .................................... 330/253; 330/260
[58] Field of Search ............... 330/252, 253, 255, 258, 330/259, 260

[56] References Cited

U.S. PATENT DOCUMENTS

4,616,189 10/1986 Pengue, Jr. ......................... 330/258

Primary Examiner—Gene Wan
Attorney, Agent, or Firm—Wenderoth, Lind & Ponack

[57] ABSTRACT

A single-stage fully differential operational amplifier has a high open-loop gain and can be incorporated in a very small area of silicon and has a very small number of bias interconnection lines. The amplifier includes two identical arms each having similar bias and loads, transconductance and common-mode feedback elements. Each of the aforementioned three elements in each branch have the same current flowing therethrough when the amplifier is quiescent.

4 Claims, 6 Drawing Sheets

FIG. 1.
(PRIOR ART)

$$V_{OUT} - V_{REF} = A(V_{IN+} - V_{IN-})$$

FIG. 2.
(PRIOR ART)

$$V_{OUT+} - V_{OUT-} = A(V_{IN+} - V_{IN-})$$

FULLY-DIFFERENTIAL OPERATIONAL AMPLIFIER FOR MOS INTEGRATED CIRCUITS

BACKGROUND OF THE INVENTION

The present invention relates to a single-stage fully differential operational amplifier having a high open loop gain, and constructed by MOS technology and comprising components (transistors) for a transconductance stage, load and bias components for the aforementioned stage and a circuit CMFB for stabilizing the quiescent output voltage, i.e., the output voltage of the operational amplifier when the differential input voltage is zero. The use of operational amplifiers in integrated circuits in MOS technology has become increasingly common in recent years, owing to the need to integrate analog circuits and sub-systems in this technology.

A summary of design techniques for MOS integrated operational amplifiers (NMOS or CMOS) is given e.g. in the article "MOS Operational Amplifier Design—A Tutorial Overview" by P. R. Gray and R. G. Mayer, in "IEEE Journal of Solid-State Circuits", Vol., SC-17, No. 6, page 969, December 1982.

Figure 1:
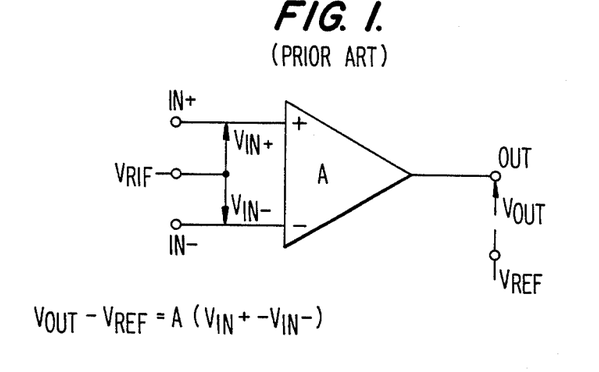
FIGS. 1-3 illustrate prior art operational amplifiers.

The main requirements for an operational amplifier ("OPAMP") integrated into a monolithic MOS circuit (See FIG. 1, for example, where $V_{REF}$ and $V_{RIF}$ are two fixed voltages which are not necessarily different from one another, and A is the open-loop gain of the amplifier) are as follows:

high open-loop gain
short settling time
capacity to drive capacitive loads
high rejection to the supply voltage "PSRR", Power Supply Rejection Ratio and
low input-referred noise.

Other requirements which are particularly useful for integrated operational amplifiers are:
occupation of small area of silicon
ease of interconnection with other parts of the integrated circuit
large swing of output voltage with low harmonic distortion and
limited power dissipation.

A recently-established method of design uses operational amplifiers with a differential output ("fully-differential" or "double-ended" amplifiers) where the output voltage is taken not between the individual amplifier output and a fixed reference voltage (e.g. ground or another voltage generated inside the integrated circuit) but between the two amplifier output. A fully-differential amplifier is designed so that the two voltage signals are symmetrical relative to a reference voltage $V_{REF}$ (See FIG. 2, for example).

A main difference between single-ended and fully-differential operational amplifiers is that the latter do not have a reference node common to the input and the output of the operational amplifier.

An essential advantage of the fully-differential approach is that the following improvements are obtained:
(1) An improvement in the maximum swing of the effective output voltage;
(2) A reduction in the harmonic distortion in the output signal (more particularly in the harmonic distortion due to even harmonics) and
(3) An increase in the value of the PSRR.

Figure 2:
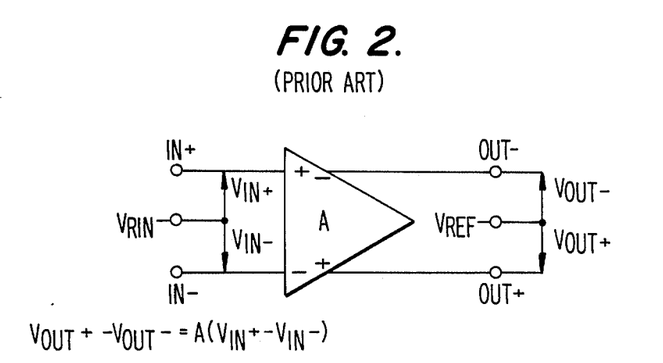

A typical problem in this class of amplifiers is the need to design circuitry which fixes the "quiescent" voltage of the two outputs (i.e.—the voltages present at the two outputs in the absence of signals applied to the inputs) at a value which ensures a symmetrical, maximum swing of output signals (the quiescent output voltage is in general $V_{REF}$, see FIG. 2).

Frequently, (typically when the circuit is supplied with a single voltage) the quiescent voltage of the two inputs is also fixed by circuitry which optimizes the input level with regard to the circuit requirements of the amplifier. (This voltage in general is $V_{RIN}$, see FIG. 2).

One method used for designing "fully-differential" amplifiers uses two stages in cascade in order to meet the basic requirement of high gain, since each stage by itself has insufficient gain for the desired application.

The main and well-known disadvantage of this approach is that a two-stage amplifier requires the use of a rather higher compensation capacitor (whose size increases with increasing load), disposed between the first and second stage, to ensure the stability of the system in which the amplifier is inserted. This also appreciably increases the area occupied by the amplifier.

An alternative known method of design, which is becoming increasingly successful, uses a single amplifier stage which by itself has a sufficiently high gain to meet requirements. A main advantage of this type of amplifier is that it eliminates the need for a compensating capacitor.

Basically, a single-stage amplifier is an amplifier which has only one stage having a high transconductance gm and performing a transfer function $$I_{OUT} = gm V_{IN} \quad (1)$$

where $I_{OUT}$ represents the output signal current of the stage and $V_{IN}$ represents the input signal voltage. In the complete amplifier, voltage amplification is obtained as a result of the drop produced by $I_{OUT}$ across an output impedance $Z_{OUT}$, as a result of which the open-loop voltage gain of the amplifier, A, is:

$$A = gm Z_{OUT} \quad (2)$$

Figure 3:
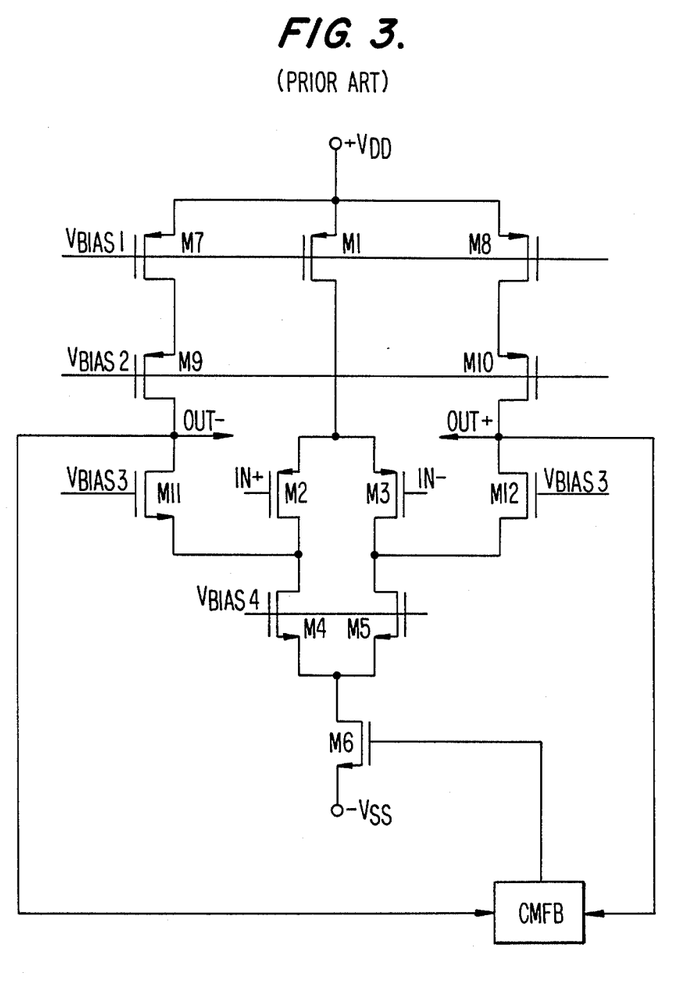

One example of this type of single-stage approach uses a stage known as a "folded cascode" (see FIG. 3, and page 979 of the previously cited article, for example). In FIG. 3 and the subsequent figures, the NMOS and PMOS transistors are understood as having their "body" electrode connected to the more negative and the more positive supply voltage respectively, except where otherwise indicated. In the circuit in FIG. 3, more particularly, any of the transistors can have its "body" electrode connected to its "source" electrode if specially required.

In the conventional circuit in FIG. 3, the high-transconductance components are transistors M2 and M3. Transistors M1, M4, M5, M7–M12 serve to meet the load and bias requirements of the stage. Transistor M6 is for fixing the quiescent voltage of the outputs.

In the diagram in FIG. 3, a rectangle indicates the circuit unit for stabilizing the quiescent output voltage (CMFB=common mode feedback). This circuit unit can be constructed in different ways, depending on circuit requirements. For example, the feedback path can be embodied by continuous-time or sample-time circuitry. With regard to the previously-stated requirements, the amplifier shown in FIG. 3 behaves as follows:

open-loop gain: high settling time: depends on the load capacitance but in any case is not larger than for a two-stage amplifier driving capability of capacitive loads: good, without the need to add a compensating capacitor of equal value to the load capacitance PSSR excellent, in that the output voltage is taken between the OUT+ and OUT− junctions without being referred to a fixed voltage input-referred noise: fairly low (of the same order as for the two-stage amplifier)

area of silicon occupied: less than for the two-stage amplifier ease of interconnection: depends on the number of different bias voltages needed for proper operation of the amplifier output voltage swing: good, in that the output voltage is taken between two complementary outputs. The maximum swing depends on the bias voltages and the dimensions and threshold voltage of the transistors making up the "cascode".

power dissipation: depends on the required settling time and is substantially fixed by the bias voltage $V_{BIAS1}$.

Even with these advantages, single-stage fully-differential operational amplifiers available at present are not free from limitations and disadvantages. For example, with their present structure they cannot easily satisfy the increasingly high requirements regarding compactness; ease of interconnection with the other parts of the integrated circuit in which the amplifier is inserted; suitability for integration into circuits with a single supply, even at a low-voltage; reduction in dissipated power; possibility of integration on minimum area of silicon with minimum number of bias interconnection lines with the rest of the circuit, etc.

SUMMARY OF THE INVENTION

The object of the present invention is to provide a single-stage fully differential operational amplifier which does not have the aforementioned limitations, and has particularly satisfactory performance, and has optimum characteristics.

According to the present invention, this and other aims are obtained by an amplifier of the kind specified in the opening part of the description and in the attached claims, characterized in that it is substantially made up of two identical branches, each comprising similar bias and load, transconductance, and common-mode feedback elements. Each of the three aforementioned elements of each branch has the same current flowing therethrough when the amplifier is quiescent (i.e., when the differential input voltage is zero).

The abovenoted object may be effected by providing a single-stage fully differential operational amplifier having a high open-loop gain and first and second inputs and first and second outputs comprising first and second substantially identical branches each comprising a bias and load stage and a transconductance stage and a common mode feedback stage connected in series; said first and second inputs being respectively connected to inputs of said transconductance stages of said first and second branches and said first and second outputs being respectively connected to outputs of said bias and load stages of said first and second branches and inputs of said common mode feedback stages of said first and second branches being respectively connected to said output of said bias and load stages of said first and second branches; wherein said transconductance stages transform inputs signals supplied thereto and said bias and load stages provide biasing and electrical loads for their respective transconductance stages and said common mode feedback stages stabilize output voltages of their respective bias and load stages when said input signals to their respective transconductance stages are equal to zero; and wherein when said input signals are equal to zero, currents flowing through said first and second branches are equal.

BRIEF DESCRIPTION OF THE DRAWINGS

Other features and important characteristics of the invention will be specified in the claims and can be gathered from the description of the preferred (non-limitative) embodiments shown in the accompanying drawings.

DESCRIPTION OF THE PREFERRED EMBODIMENT

Figure 4:
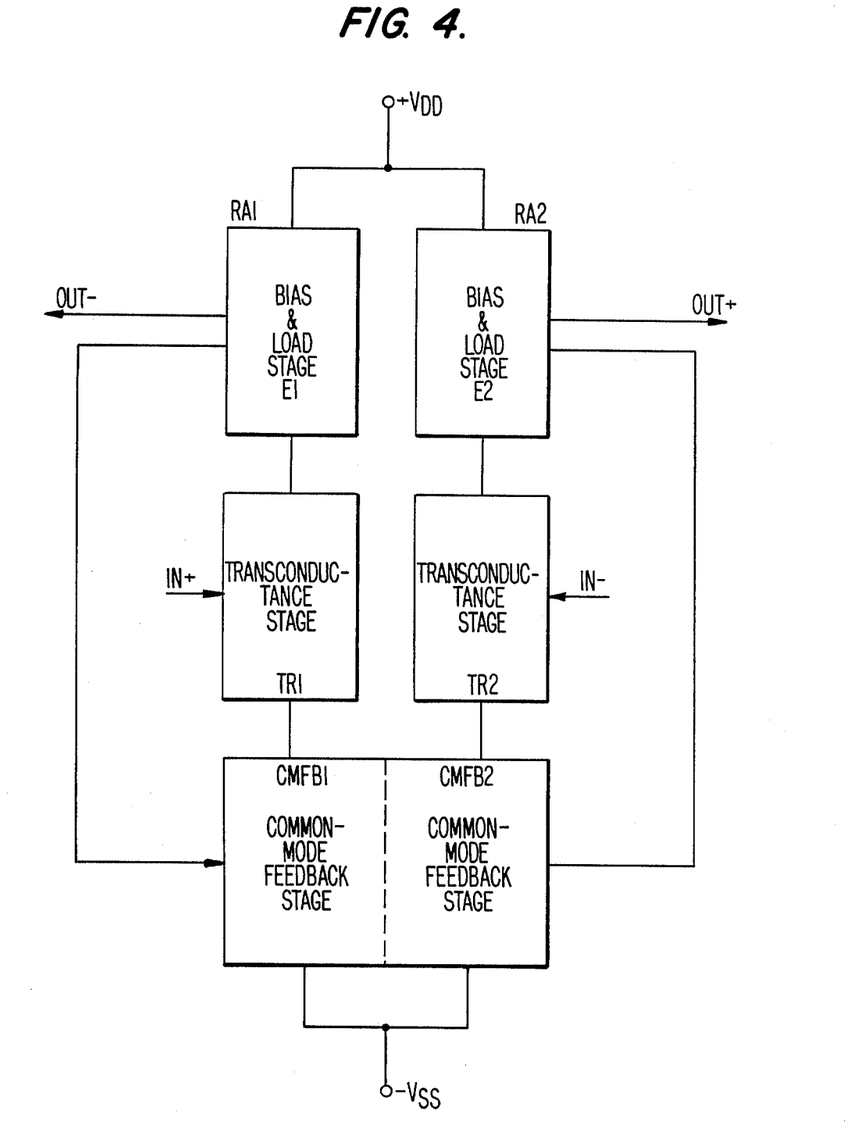
FIG. 4 illustrates, in block diagram form, an operational amplifier in accordance with the present invention.

FIG. 4 shows an amplifier according to the invention substantially comprising two exactly similar branches RA1 and RA2, each comprising identical bias and load stages E1 and E2 and identical transconductance stages TR1 and TR2 and common-mode feedback stages. The overall common-mode feedback stage is made up of two identical halves CMFB1 and CMFB2. The units can be disposed as shown in FIG. 4 or differently. For example, the position of the load and bias stages E1 and E2 and the common-mode feedback stages CMFB1 and CMFB2 can be reversed in the two branches.

Each branch RA1 and RA2 of the operational amplifier according to the present invention is characterized in that the quiescent current through each of the three basic stages (bias and load stages E1 and E2, and transconductance stages TR1 and TR2, and common-mode feedback stages CMFB1 and CMFB2) is the same. More specifically, with regard to the quiescent current, the three stages of each branch should be considered in series with one another. With regard to the signal current, the common-mode feedback stage must be such as to have a total resistance which is independent of the presence of a differential signal at the input or output, so as not to influence the behavior of the amplifier with respect to the differential signal.

Figure 5:
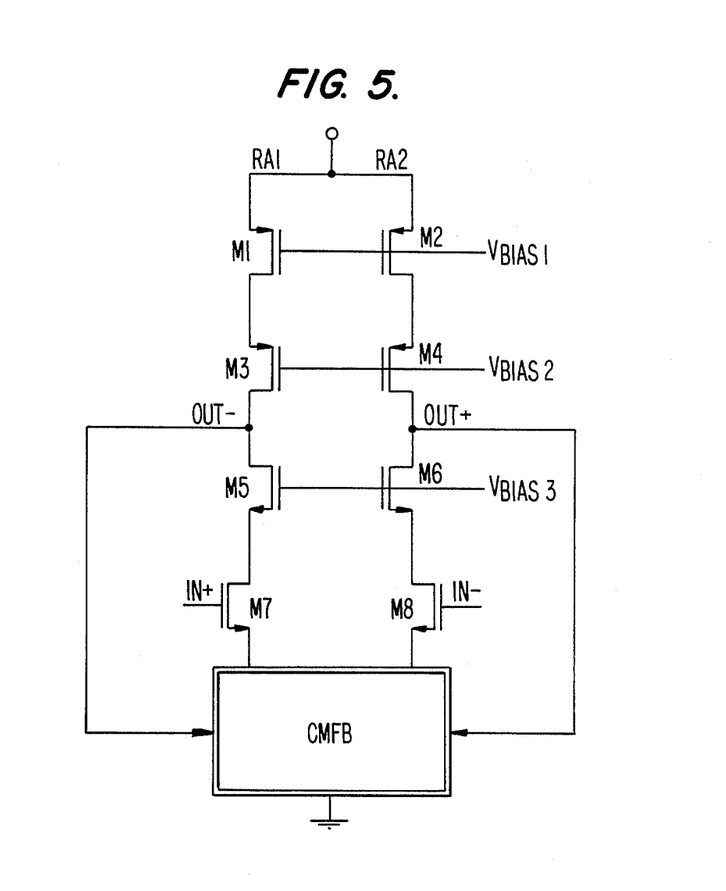
FIG. 5 illustrates a more detailed version of the amplifier of FIG. 4.

A preferred but non-limitative embodiment of this invention is shown in FIG. 5.

This embodiment is very efficient, more particularly with regard to compactness and ease of interconnection with the other parts of the integrated circuit in which the amplifier is inserted. It is also particularly suitable for incorporation into circuits operating from a single-voltage supply ($+V_{DD}$, 0), even at a low supply voltage (e.g. $V_{DD}=+5$ V). The dissipated power may also be less than in the known solution previously mentioned, for a given settling time, since there are only two branches between the supply and ground. The transistors placed in "symmetrical" positions in the two branches RA1 and RA2 are identical with one another (M1=M2, M3=M4, M5=M6, M7=M8).

The bias voltages ($V_{BIAS1}$, $V_{BIAS2}$ and $V_{BIAS3}$), which are not necessarily all different from one another, are generated by circuitry (not shown) so to have values such that transistors M1–M8 are driven into saturation both when the amplifier is quiescent and when the input signal is applied.

Figure 6:
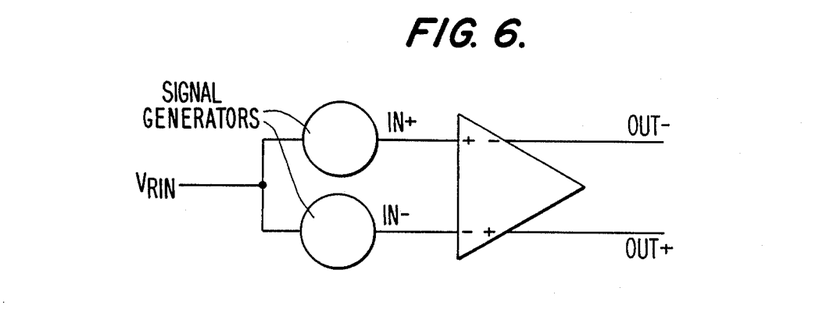
FIG. 6 illustrates the interconnection of an amplifier in accordance with the present invention.

The input voltages $V_{IN+}$ and $V_{IN-}$ applied to terminals IN+ and IN− respectively are symmetrical relative to an input reference voltage which we shall call $V_{RIN}$ and which is generated inside the integrated circuit, which must be such as to ensure optimum operation of the amplifier. The circuit configuration adopted for the amplifier is therefore as shown in FIG. 6. We shall shortly see a proposed embodiment of a circuit for generating the voltage $V_{RIN}$.

Figure 7:
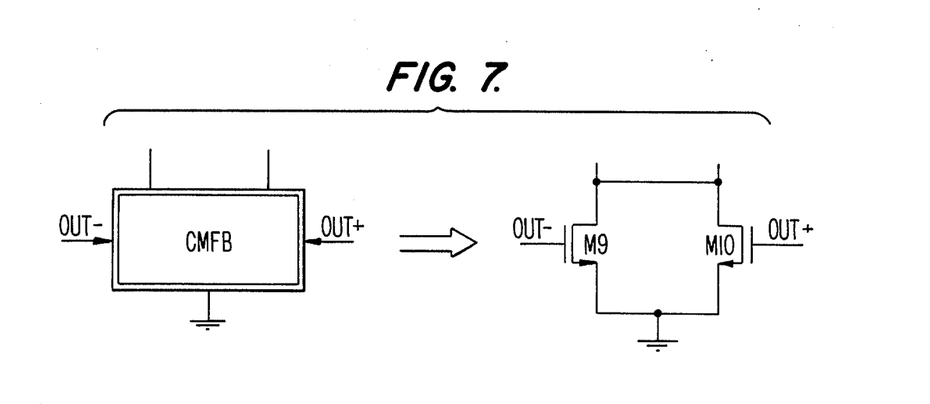
FIG. 7 illustrates a portion of an amplifier in accordance with the present invention.

In the embodiment shown here for the operational amplifier, the common-mode feedback stage is constructed as shown in FIG. 7.

In this circuit, transistors M9 and M10, which are identical, operate in their linear region.

Figure 8:
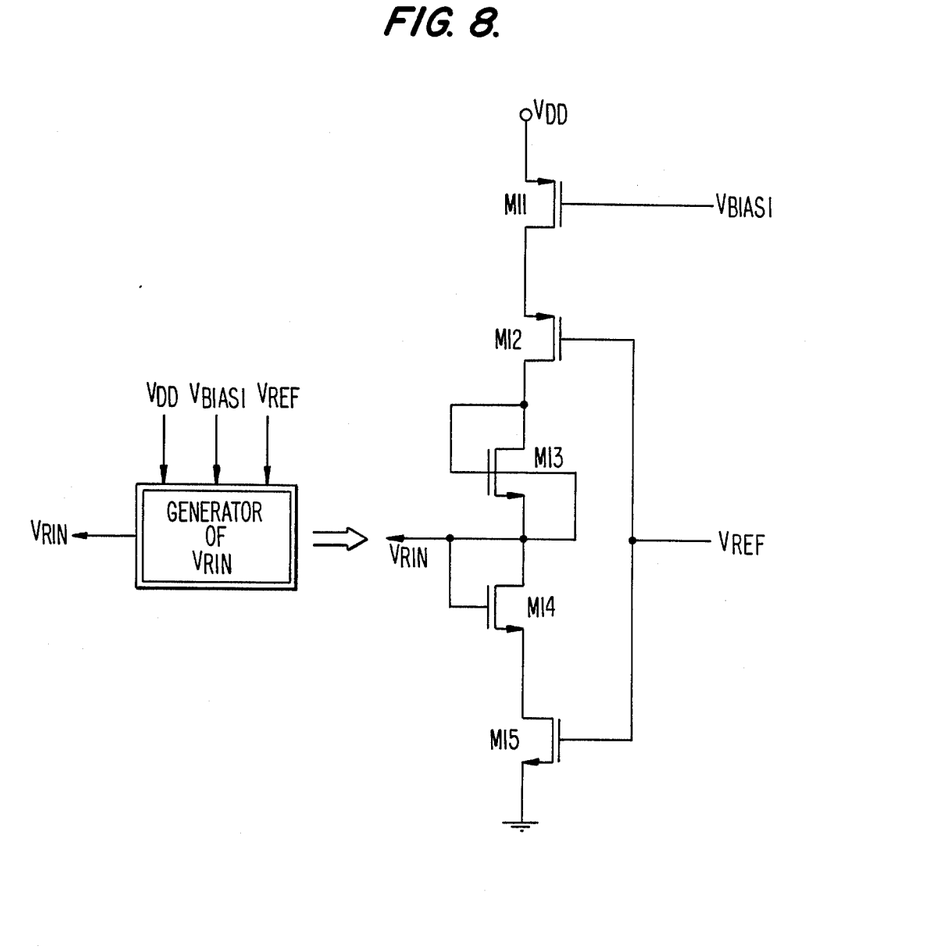
FIG. 8 illustrates a reference voltage generator circuit for the operational amplifier in accordance with the present invention.

To obtain maximum ease of interconnection with the other parts of the integrated circuit, we can put $V_{BIAS2}=V_{BIAS3}=V_{REF}$, and use the circuit in FIG. 8 as the unit for generating the input reference voltage $V_{RIN}$. This circuit is an exact replica of one of the two branches RA1 or RA2 of the operational amplifier, except for the connection to the "body electrode" of transistor M13. This difference of connection is not important, but is useful for permitting the configuration described here to be used with a supply voltage of a single polarity and a low value (e.g. 5 V). We shall therefore have M11=M1, M12=M3, M13=M5, M14=M7 and M15=M9.

In the case examined, the circuit in FIG. 8 is a replica of RA1 in FIG. 5. Alternatively the unit for generating the voltage $V_{RIN}$ can be constructed from one of the two branches of the operational amplifier without altering the configuration described hereinbefore but using the same scale factor K for the width of all the transistors. In that case, the current flowing through the branch for generating the voltage $V_{RIN}$ will also be scaled by the factor K but the advantages of the $V_{RIN}$ generating system described here will be retained. In practice the $V_{RIN}$ generating unit can be obtained, even at the "layout" generation level, by using one of the two branches of the operational amplifier and making the required modification in the "body electrode" connection of the transistor M13.

This circuit configuration ensures that the quiescent output voltages (the voltages at the junctions OUT+ and OUT−) are equal to $V_{REF}$ whereas the input reference voltage $V_{RIN}$ is automatically brought to the level which optimizes the operation of the operational amplifier.

Figure 9:
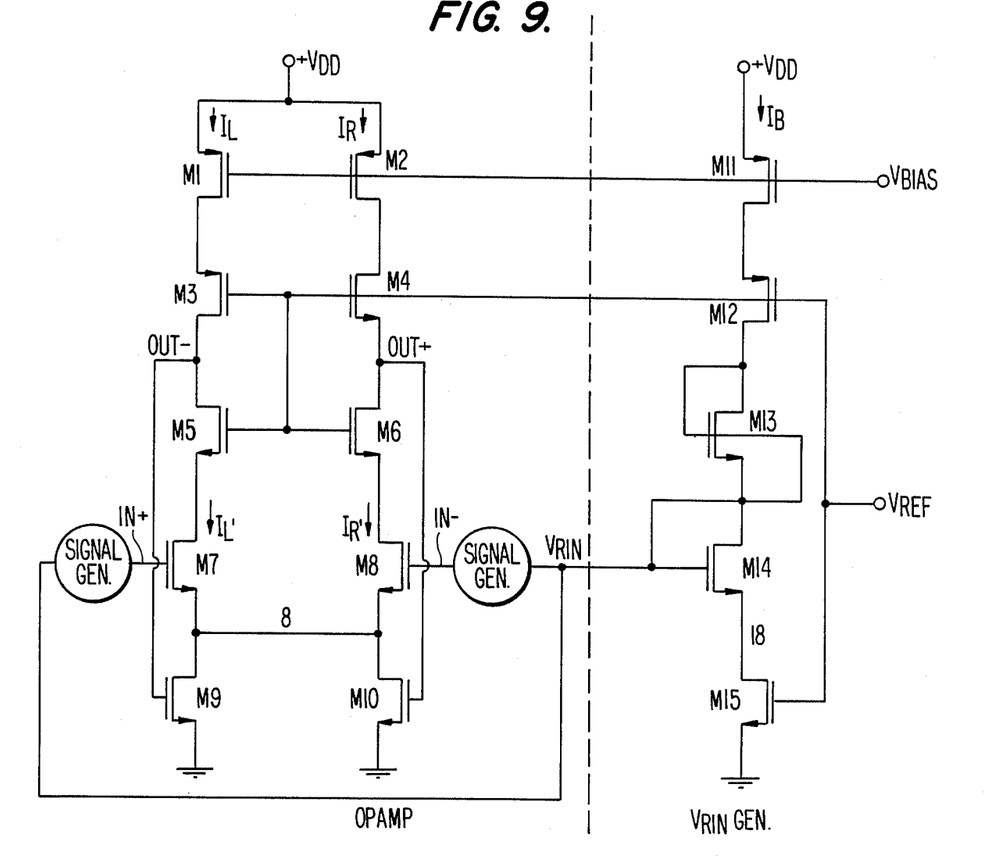
FIG. 9 illustrates the circuit diagram of an amplifier in accordance with the present invention.

The complete circuit for the operational amplifier and the associated generator of the reference voltage $V_{RIN}$ is shown in FIG. 9, in which the dotted line separates the actual operational amplifier OPAMP which is substantially as shown in FIG. 5 from the $V_{RIN}$ generator $V_{RIN}$GEN which is substantially as shown in FIG. 8.

The operational amplifier operates as follows:

When quiescent, i.e. when the input signal voltages are zero, currents $I_L'$ and $I_R'$ are equal to one another and (apart from the scale factor K) to the current $I_B$ in the branch for generating the voltage $V_{RIN}$, which is determined by the bias voltage $V_{BIAS}$.

The currents through transistors M7, M8, and M14 will also therefore be equal, and consequently junctions 8 and 18 will be at the same voltage. In fact, M7, M8 and M14 are "source followers" identical with one another and with the same "gate" voltage, and are both in their saturated region and have the same current flowing therethrough.

Consequently, junctions OUT+ and OUT− will be at the same "gate" voltage as transistor M15, i.e. at $V_{REF}$. If the voltage of the OUT+ and OUT− junctions were greater than $V_{REF}$, it would be lowered by the common-mode feedback, since the current through both branches (M5, M7, M9) and (M6, M8, M10) will be greater than in branches (M1, M3) and (M2, M4). The contrary will happen if the voltages in junctions OUT+ and OUT− are below $V_{REF}$.

It should be noted that the current in branches (M1, M3) and (M2, M4) is not, as a first approximation, dependent on the presence of a voltage at the input terminals of the operational amplifier, provided of course this voltage remains within limits guaranteeing proper operation of the amplifier. In FIG. 9 the currents in these two branches are indicated by $I_L$ and $I_R$ respectively.

When a differential signal is applied between junctions IN+ and IN− (e.g. [VIN+]−[VIN−]>0), there will be a variation in the values of the current $I_L'$ and $I_R'$ ($I_L'>I_R'$), resulting in an unbalance (due to the signal) between the voltages VOUT+ and VOUT− ([VOUT+]−[VOUT−]>0). Since the impedance of junctions OUT+ and OUT− is very high ("cascode" stage), the open-loop gain between ([VIN+]−[VIN−]) and Δ ([VOUT+]−[VOUT−]) Δ is very high.

As we shall now see, the unbalance in the signal between voltages VOUT+ and VOUT− does not at a first approximation influence the common-mode feedback, since the sum ([VOUT+]+[VOUT−]) remains constant and M9 and M10 are operated in their linear region. In this region the relationship between the current through a transistor and the "gate" voltage VG is:

$$Ids = 2k'Vds(Vg - Vs - Vt - Vds/2)W/L \quad (3)$$

where
k′=conduction factor (per square) of the transistor
Vds=voltage between "drain" and "source" of the transistor
Vg="gate" voltage of the transistor
Vs="source" voltage of the transistor
Vt=threshold voltage of the transistor
W=effective width of the transistor
L=effective length of the transistor.

The total current ICM flowing through transistor M9 and M10 will therefore be:

$$ICM = Ids9 + Ids10 = 2k'Vds(- \\ VOUT+ - Vs - Vt - Vds/2)W/L + 2k'Vds(- \\ VOUT- - Vs - Vt - Vds/2)W/L \quad (4)$$

where the quantities k′, Vds, Vg, Vs, Vt, W and L relate to the two transistors.

Putting VOUT=VOUT0+ΔV both for VOUT+ and for VOUT−, where VOUT0 is the quiescent output voltage of the operational amplifier and $\Delta V$ is the signal voltage at one amplifier output, we obtain $$ICM = 2k'Vds(-2VOUTO + \Delta V+ + \Delta V- -2Vs - 2Vt - 2Vds/2) = 4k'Vds \cdot (VOUTO - Vs - Vt - Vds/2) \quad (5)$$

since $\Delta V+ = -[\Delta V-]$ for the signal. In equation (5) account has been taken of the fact that, in the case of the two transistors M9 and M10, W/L, Vs and Vds are equal and Vt and k' can be assumed to be approximately equal.

Thus, the resistance of the common-mode feedback unit (M9, M10) is with good approximation independent of the differential signal voltage at the output. The circuit proposed in FIGS. 5–9 therefore is a single-stage fully differential operational amplifier having high open-loop gain, integratable on a minimum area of silicon and with a minimum number of interconnection and bias lines with the rest of the circuit (2 in the minimum case: $V_{REF}$ and $V_{BIAS}$). This also automatically fixes the common-mode output voltage.

In the embodiment shown in FIG. 9 the maximum output swing is $|VTN| + |VTP|$, where VTN is the threshold voltage of the N channel transistor (transistors M5 and M6) and VTP is the threshold voltage of the P channel transistor (transistors M3 and M4). If it is desired to increase the swing of each of the two voltages VOUT+ and VOUT−, use can be made of transistors having a high threshold voltage (e.g.—by suitable doping) for the components M3–M6. Alternatively two different bias voltages can be used for the lines $V_{BIAS2}$ and $V_{BIAS3}$ (see FIG. 5), abandoning the extremely simple interconnections characteristic of the embodiment shown in FIG. 9.

The circuit according to the present invention is advantageously capable of operating even with a single supply voltage of 5 V, when the absolute value of the nominal threshold voltage of the transistors is 1 V, due to the suitable arrangement of the transistors in the actual amplifier and the reference generator $V_{RIN}$GEN. As stated previously, the connection between the "source" and "body" of transistor M13 has been introduced specifically to enable the circuit to also operate at a low supply voltage. Transistor M13 is the only one which does not require exact symmetry between the corresponding parts of the two branches of the operational amplifier.

In a particularly compact alternative embodiment the reference generator $V_{RIN}$GEN can be constructed by eliminating transistor M13 and connecting the "drain" electrodes of transistor M12 and transistor M14 together. To ensure operation in the linear region of M9, M10 and M15 in applications with lower supply voltages, these transistors can be constructed using devices having a lower threshold voltage than used for the other N channel transistors (e.g.—transistors in which the threshold voltage is lowered by doping). To facilitate the "layout" and to increase the compactness, the "body" electrodes of all of the transistors in the amplifier are connected to the appropriate supply voltage (VDD for the P-channel transistors, VSS for the N-channel transistors).

The reference voltage generator can, in general, be shared by a number of identical operational amplifiers (e.g.—all those in a filter or a circuit unit).

Of course other configurations are possible, where the construction and positions of the individual operational-amplifier units can be different. In one configuration, for example, the common-mode feedback stage can be constructed using P-channel transistors and be directly connected to the positive supply terminal, which is connected to the "source" electrodes of the two transistors. The high transconductance stage will be constructed using P-channel transistors and the bias and load stage will be constructed using N-channel transistors and will be physically placed between the high-transconductance stage and the negative supply terminal.

If specifically required, any transistor in the operational amplifier (or all of them) can be constructed by connecting the "body" electrode to the "source" electrode instead of to the appropriate supply terminal.

For the sake of clarity, the invention has been described with reference to embodiments which are particularly simple and therefore shown in the drawings; the embodiments can be varied and modified (e.g. the number of stages can be different from three) in a manner which is within the scope of the skilled addressee and will of course be included within the range and wider spirit of the invention.

What is claimed is:

1. A single-stage fully differential operational amplifier having a high open-loop gain and first and second inputs and first and second outputs comprising first and second substantially identical branches each comprising a bias and load stage and a transconductance stage and a common mode feedback stage connected in series; said first and second inputs being respectively connected to inputs of said transconductance stages of said first and second branches and said first and second outputs being respectively connected to outputs of said bias and load stages of said first and second branches and inputs of said common mode feedback stages of said first and second branches being respectively connected to said outputs of said bias and load stages of said first and second branches; wherein said transconductance stages transform inputs signals supplied thereto and said bias and load stages provide biasing and electrical loads for their respective transconductance stages and said common mode feedback stages stabilize output voltages of their respective bias and load stages when said input signals to their respective transconductance stages are equal to zero; and wherein when said input signals are equal to zero, currents flowing through said first and second branches are equal.

2. An amplifier as in claim 1, wherein each transconductance stage comprises an MOS transistor and each bias and load stage comprises a pair of MOS transistors and each common mode feedback stage comprises an MOS transistor.

3. An amplifier as in claim 1, further comprising a reference voltage generator for supplying a reference voltage to said first and second inputs, said reference voltage generator being substantially identical to one of said first and second branches of said amplifier.

4. An amplifier as in claim 2, further comprising a reference voltage generator for supplying a reference voltage to said first and second inputs, said reference voltage generator being substantially identical to one of said first and second branches of said amplifier.

* * * * *